United States Patent [19]

Dobarganes

[11] 3,968,433
[45] July 6, 1976

[54] FIXTURE FOR TESTING FLATPACK MODULES

[75] Inventor: Joseph Dobarganes, Fords, N.J.

[73] Assignee: Lawrence Peska Associates, Inc., New York, N.Y. ; a part interest

[22] Filed: Aug. 22, 1974

[21] Appl. No.: 499,511

[52] U.S. Cl. .......................... 324/158 F; 324/72.5; 324/158 P
[51] Int. Cl.$^2$ .................... G01R 31/02; G01R 1/06
[58] Field of Search ............ 324/158 F, 158 P, 72.5; 317/101 R, 101 A; 339/17 CF, 75 M

[56] References Cited
UNITED STATES PATENTS

| | | | |
|---|---|---|---|
| 3,297,974 | 1/1967 | Pittman | 339/75 M |
| 3,391,383 | 7/1968 | Antes | 324/158 F |
| 3,573,617 | 4/1971 | Randolph et al. | 324/158 F |
| 3,667,037 | 5/1972 | Kierce | 324/73 R |

Primary Examiner—R. V. Rolinec
Assistant Examiner—Ernest F. Karlsen

[57] ABSTRACT

A fixture for testing flatpack modules which has a base section having a recess defined therein dimensioned and configured for engagement with the body of a flatpack module. A plurality of first connectors is disposed in a single plane on at least two sides of the recess. A second section having a generally inverted "U-shaped" cross section, the depending leg portions thereof disposed in generally parallel relationship and spaced a distance substantially equal to the distance between the sides of the recess having contacts disposed adjacent thereto. Electrically conducting members are disposed within the second section and are positioned for engagement with the module. A third section is provided having contact in electrical communication with the conductive members of the second section.

4 Claims, 3 Drawing Figures

U.S. Patent  July 6, 1976  3,968,433
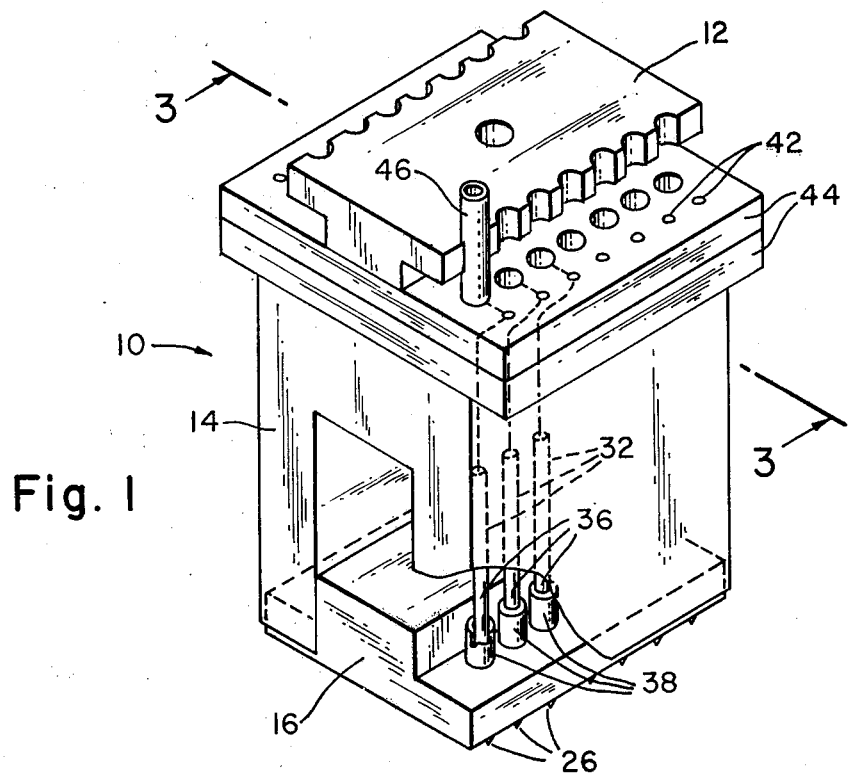
Fig. 1
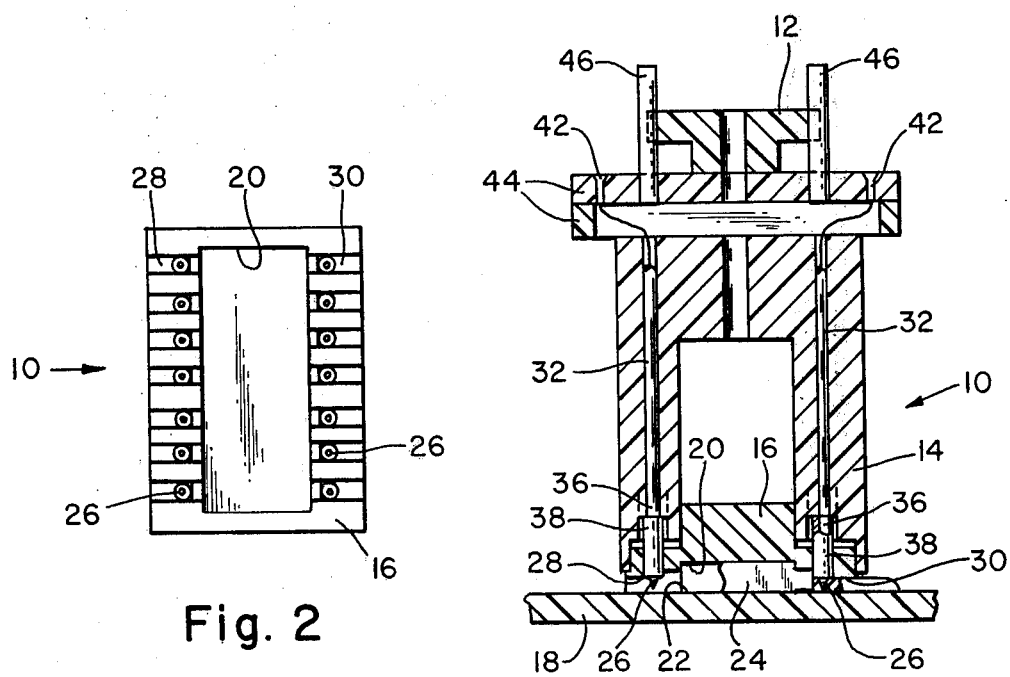
Fig. 2
Fig. 3

FIXTURE FOR TESTING FLATPACK MODULES

The field of the invention relates to apparatus for testing electrical components and particularly to apparatus for testing flatpack modules such as that disclosed in Michaels, U.S. Pat. No. 3,515,949 issued June 2, 1970. The apparatus which has heretofor been provided for testing such flatpack modules has not been adapted for cooperation with conventional test connectors which are suitable for connection to a computer, machine or other test apparatus.

Accordingly it is the primary object of the invention to provide apparatus which would simply and quickly connect to a flatpack module and be provided with connector means which will cooperate with conventional connectors.

Still another object of the invention is to provide apparatus which is simple and inexpensive to manufacture and which will cooperate with the commercially available "connectors".

In the drawings:

FIG. 1 is a perspective view of the center and connector sections of the apparatus in accordance with the invention;

FIG. 2 is a bottom view of the first or plug section of the apparatus in accordance with the invention; and FIG. 3 is a sectional view taken through the line 3—3 of FIG. 1.

Referring now to FIGS. 1, 2 and 3 there is shown the fixture 10 in accordance with the invention. The fixture includes a connector section 12, a center section 14, a plug section 16 and a base 18. The plug section 16 and base 18 are provided with cooperating recesses 20, 22 for engaging a flatpack module 24. Not visible in the view of figure are the electrical contacts of flatpack module 24 which extend from two opposed sides of the generally rectangular module. The contacts of the module extend to the left and to the right in the view shown therein for engagement with a corresponding number of spring tension sharp tipped pins 26. The base 18 has a generally planar section on which is disposed ribs 28, 30 to define the recess 22. The center section 14 is selectively positioned for engagement with the ribs 28, 30 and includes a plurality of electrically conductive elongated members. Extending along each leg of the generally "U-shaped" cross-section of the center section 14. At the lower extremity of each electrically conducting member 32 is disposed a male pin 36 for connection to a female cylindrical connector 38 which is in turn an electrical communication with the spring tension sharp tipped pins 26.

At the upper extremity of each electrically conducting member 32 is disposed a wire which is in turn connected with an eyelet 42 carried within a skirt section 44 of the connector section 12. A female pin 46 may also be carried in the connector section 12 for connection with each elongated conductor 32.

An operating signal will be detected at the connector section 12 and fed into a machine computer or a oscilliscope. Ordinarily the connectors provided will number fourteen since that is the conventional array for flatpacks. The means for spring tensioning the pins 26 may include coil springs or merely rely on the resilliance of a cantilevered member.

Having thus described the invention, what is claimed as new is:

1. A fixture for testing a flatpack having a rectangular body with contact strips projecting from the sides of the body in a single plane comprising: a plug section having a recess configured for engagement about the body of the associated flatpack, said plug section having a plurality of first contacts disposed in a single plane on at least two sides of said recess for engagement with said contact strips, a center section having a generally inverted "U-shaped" cross-section with two leg sections disposed in generally parallel relationship and spaced a distance substantially equal to the distance between said sides of said recess having said first contacts disposed adjacent thereto, said center section having elongated electrically conducting members therein, each of said members being selectively connected to one of said first contacts in said plug section, and a third section dimensioned and configured for engagement with said center section and having a plurality of second contacts engaging said electrically conducting members, said second contacts being disposed at a greater transverse distance from the axis of said center section than said electrically conducting members.

2. The apparatus as described in claim 1 wherein said first contacts are springs tensioned for engagement with the associated contact strips of the flatpack.

3. The apparatus as described in claim 1 wherein said first contacts are pointed.

4. The apparatus as described in claim 1 wherein said second contacts are cylindrical.

* * * * *